(12) United States Patent
Yu

(10) Patent No.: US 6,465,312 B1
(45) Date of Patent: Oct. 15, 2002

(54) CMOS TRANSISTOR WITH AMORPHOUS SILICON ELEVATED SOURCE-DRAIN STRUCTURE AND METHOD OF FABRICATION

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,602

(22) Filed: Apr. 27, 2001

(51) Int. Cl.[7] .................. H01L 21/336; H01L 21/20; H01L 21/3205
(52) U.S. Cl. .................. 438/300; 438/303; 438/305; 438/197; 438/486; 438/595
(58) Field of Search .................. 438/300, 305, 438/303, 197, 486, 595

(56) References Cited

U.S. PATENT DOCUMENTS

| | | | | |
|---|---|---|---|---|
| 5,637,518 A | * | 6/1997 | Prall et al. .................. | 438/301 |
| 5,972,763 A | * | 10/1999 | Chou et al. .................. | 438/305 |
| 6,051,473 A | * | 4/2000 | Ishida et al. .................. | 438/300 |
| 6,090,691 A | * | 7/2000 | Ang et al. .................. | 438/564 |
| 6,156,598 A | * | 12/2000 | Zhou et al. .................. | 438/231 |
| 6,380,039 B2 | * | 4/2002 | Badenes et al. .................. | 438/301 |
| 6,380,043 B1 | * | 4/2002 | Yu .................. | 438/305 |

* cited by examiner

*Primary Examiner*—John F. Niebling
*Assistant Examiner*—Ron Pompey
(74) *Attorney, Agent, or Firm*—LaRiviere, Grubman & Payne, LLP

(57) ABSTRACT

A method of fabricating CMOS transistors having an elevated source-drain structure. The method utilizes the formation of L-shaped spacers on the gate stack followed by amorphous silicon (a-Si) deposition. By way of example, the L-shaped spacers are formed by depositing a first and second spacer layer over the gate stack. The second spacer layer is etched to create a dummy spacer adjacent the gate stack. The regions of the first spacer which are unprotected by the dummy spacer are etched away. The dummy spacer is removed wherein L-shaped spacers of the first spacer layer remain adjacent the gate stack. Deep source-drain implantation is performed on the deposited layer of silicon. After implantation, silicide may be formed on the amorphous silicon at a gate-to-contact spacing determined by the thickness of the L-shaped spacer.

18 Claims, 8 Drawing Sheets

CMOS TRANSISTOR WITH AMORPHOUS SILICON ELEVATED SOURCE-DRAIN STRUCTURE AND METHOD OF FABRICATION

BACKGROUND OF THE INVENTION

1. Field of the Invention

The present invention relates CMOS device fabrication and more particularly to a CMOS transistor and fabrication method which provides an elevated source-drain structure with narrow gate-to-contact spacing.

2. Description of the Background Art

Elevated source-drain structures have been utilized within CMOS transistors to reduce the series resistance of the device when utilized with either a thicker contact or thicker silicide, or combination thereof, than utilized in conventional CMOS devices. However, current elevated source-drain CMOS transistors require a gate-to-contact spacing of between approximately one-third micron to one micron (0.3 to 1.0 micron) to reduce the formation of contact holes through the nitride spacer. Providing a method for safely reducing gate-to contact spacing within the elevated source-drain CMOS device can allow circuit density to be increased. In a traditional approach, the source and drain are raised by selective epitaxy after dielectric spacer formation. The width of the spacer (normally, nitride), along with the lithography overlay, sets the minimum limit of gate to contact spacing.

Therefore, a need exists for an elevated source-drain CMOS transistor structure and fabrication method that can provide narrow gate-to-contact spacing for creating enlarged contact junctions. The present invention satisfies that need as well as others, and overcomes the deficiencies of previously developed solutions.

BRIEF SUMMARY OF THE INVENTION

The present invention describes an elevated source-drain CMOS transistor and an associated fabrication process that can reduce gate-to-contact spacing. The method utilizes L-shaped dielectric spacers formed adjacent the gate stack to aid in controlling implantation depth while providing insulation which can reduce the necessary gate-to-contact spacing. The gate to contact spacing is often referred to as "local interconnect" (LI) distance. After formation of the L-shaped spacers, amorphous silicon (a-Si) is formed over the surface of the substrate which preferably covers the lower portion of the L-shaped spacers surrounding the gate stack. Portions of the junction are then extended into the new layer of silicon with deep source-drain dopant implantation. By utilizing the L-shaped spacers, the amount of dopant extension near the junction is restricted, while unabated extension in adjacent source and drain areas within the deposited silicon layer is allowed. The substrate is preferably annealed prior to the formation of silicide in the contact areas of the source, drain, and gate. The L-shaped spacer insulates the central portion of the source-drain channel, such that silicide may be formed over the entire exposed region of deposited amorphous silicon. It will be appreciated that the resultant silicide will be positioned a distance from the gate stack equivalent to the thickness of the deposited first dielectric layer.

An object of the invention is to increase circuit density by narrowing the gate-to-contact spacing within a CMOS transistor.

Another object of the invention is to elevate the source and drain contacts within a CMOS transistor to facilitate the formation of a deeper silicide layer.

Another object of the invention is to provide a fabrication method for a CMOS device with narrow contact distance that may be easily fabricated utilizing conventional processing equipment.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the device and method generally shown in FIG. 1 through FIG. 8. It will be appreciated that the device may vary as to configuration and as to details of the parts, and that the method may vary as to the specific steps and sequence, without departing from the basic concepts as disclosed herein. Furthermore, specific dimensions disclosed within the specification are provided by way of example in relation to embodiments configured for particular process geometries, and the methods disclosed are applicable to any range of geometries capable of supporting the techniques.

Figure 1:
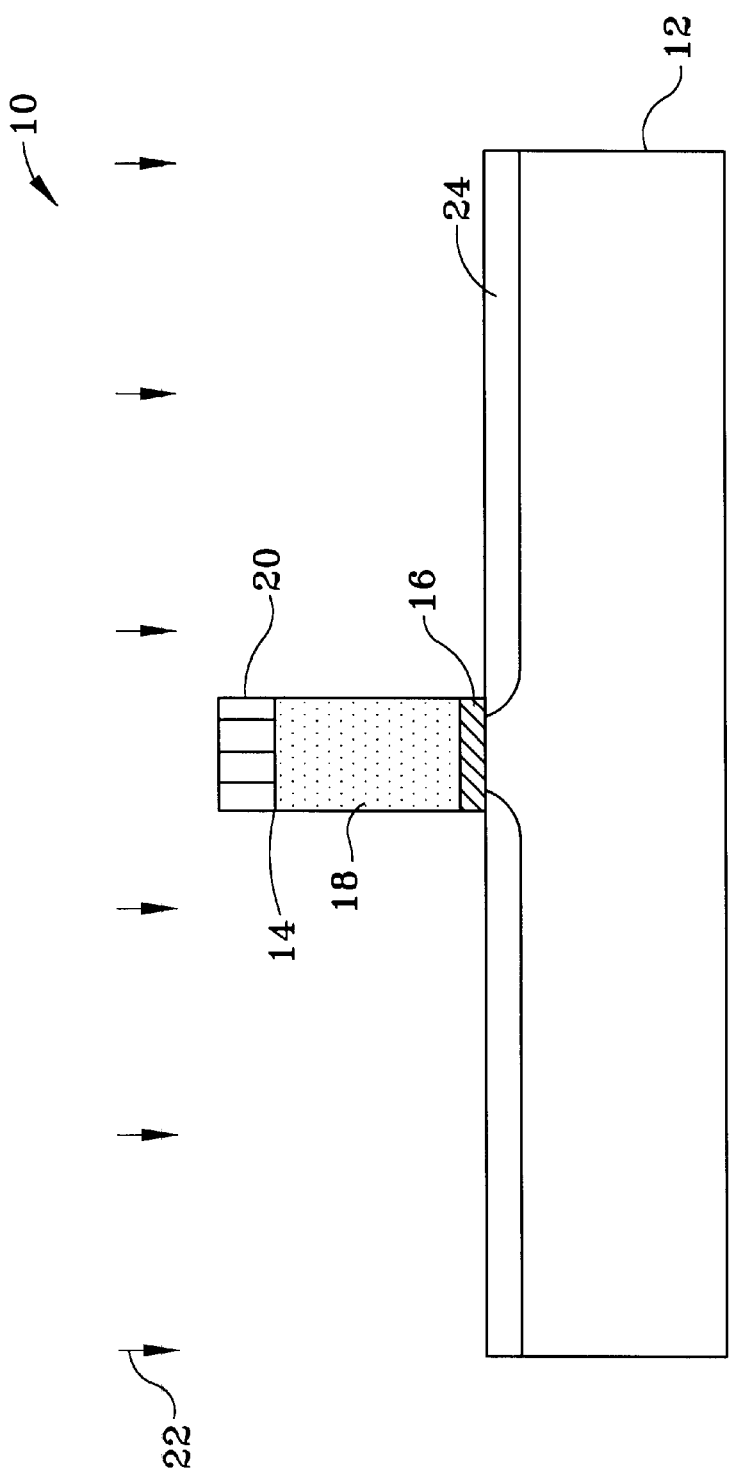
FIG. 1 is a schematic view of CMOS transistor formation on a substrate according to an aspect of the present invention shown during a preamorphization implant phase pursuant to gate stack formation.
Figure 2:
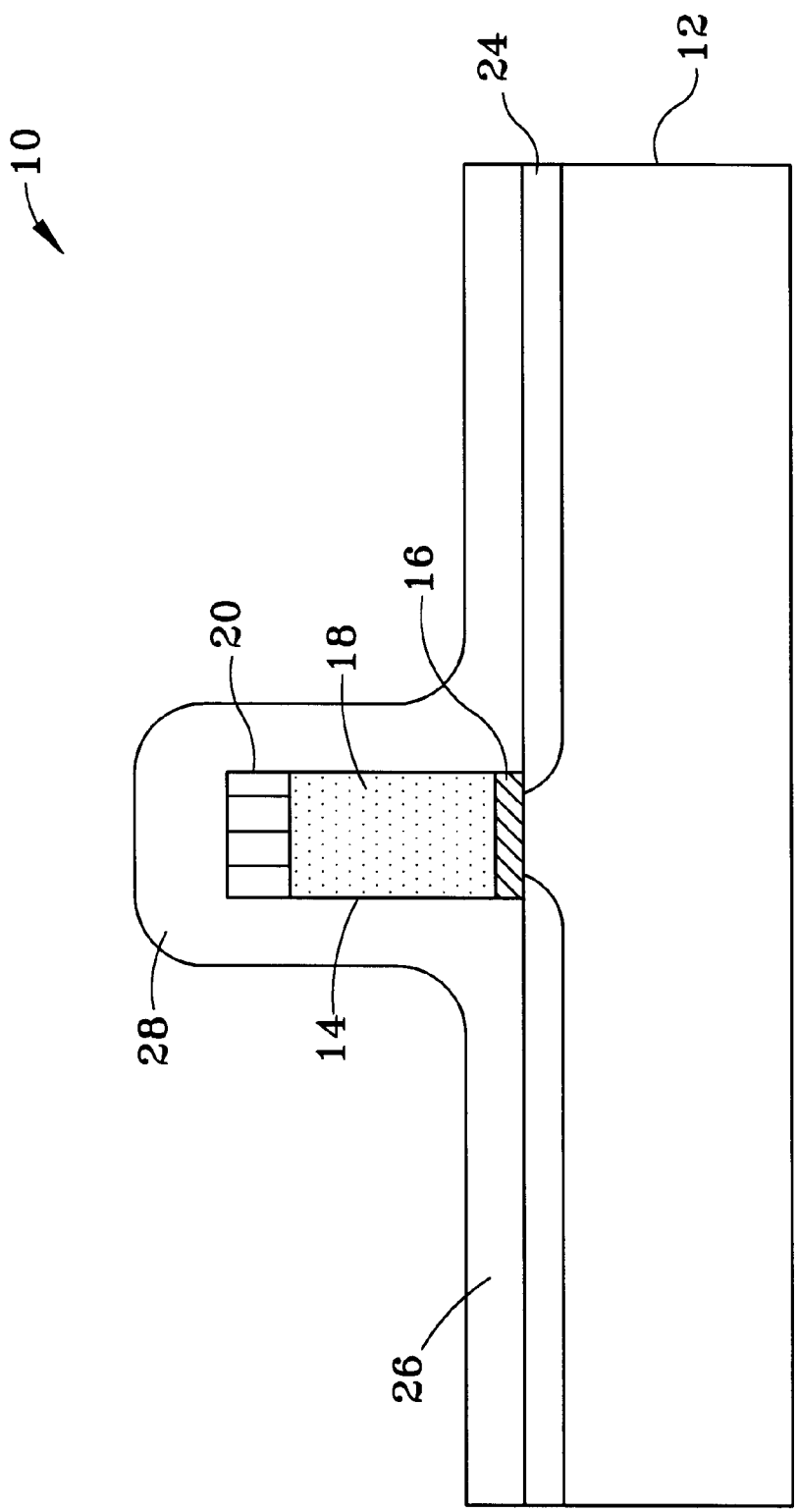
FIG. 2 is a schematic view of the CMOS transistor of FIG. 1, shown subsequent to the application of a first spacer.
Figure 3:
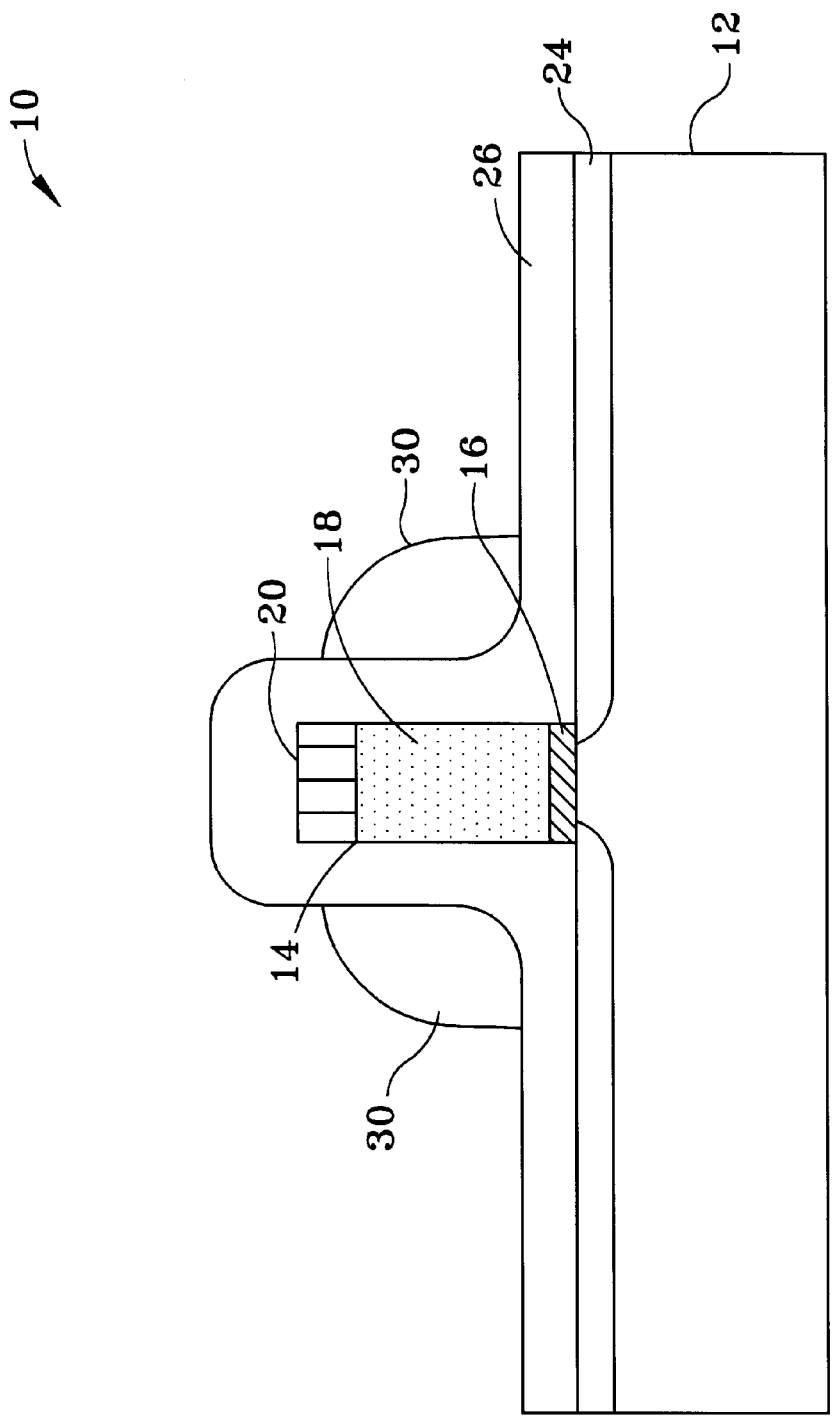
FIG. 3 is a schematic view of the CMOS transistor of FIG. 2, shown subsequent to formation of a second spacer.
Figure 4:
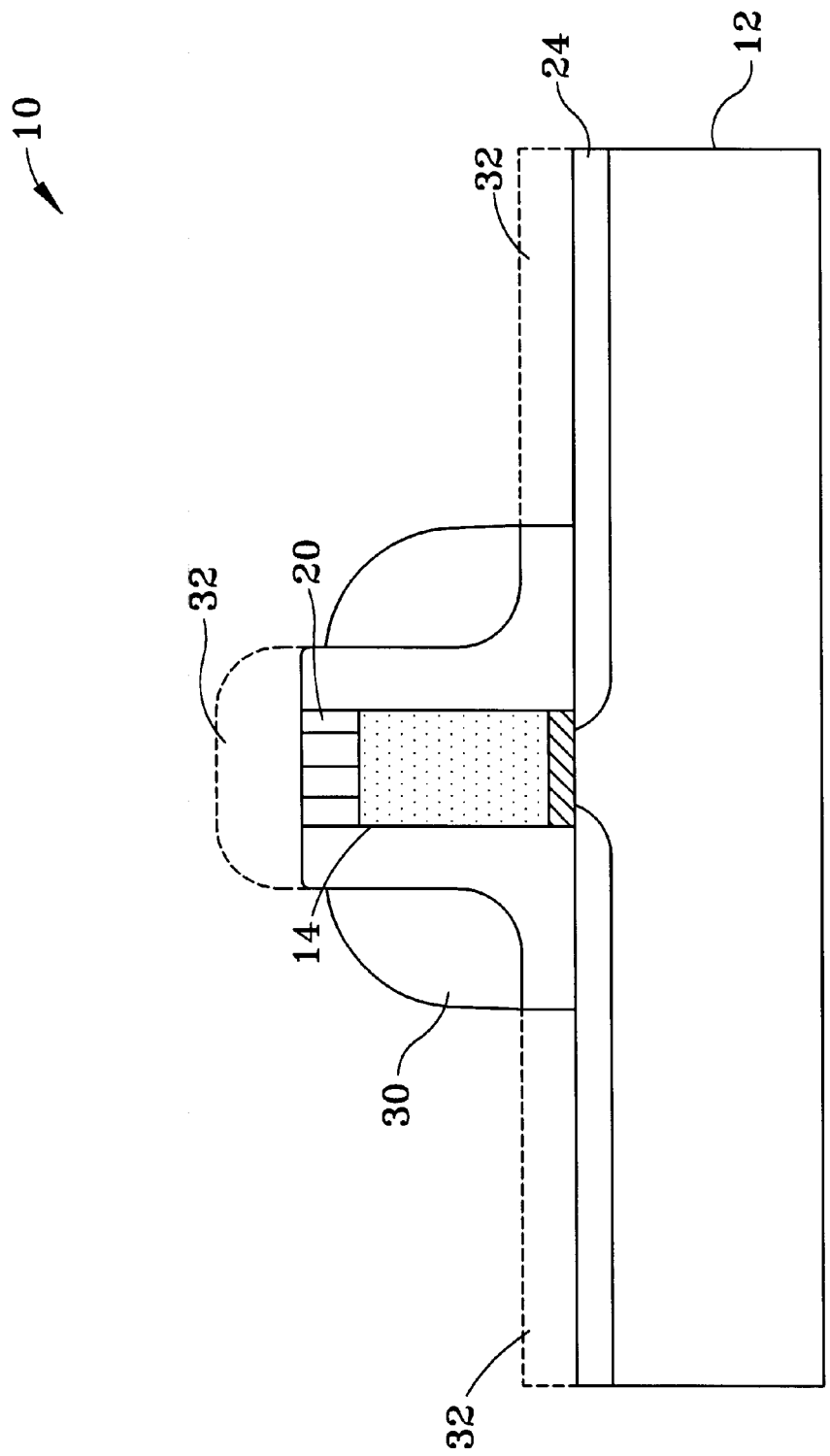
FIG. 4 is a schematic view of the CMOS transistor of FIG. 3, shown after removal of portions of the first spacer that were unprotected by the second spacer.
Figure 5:
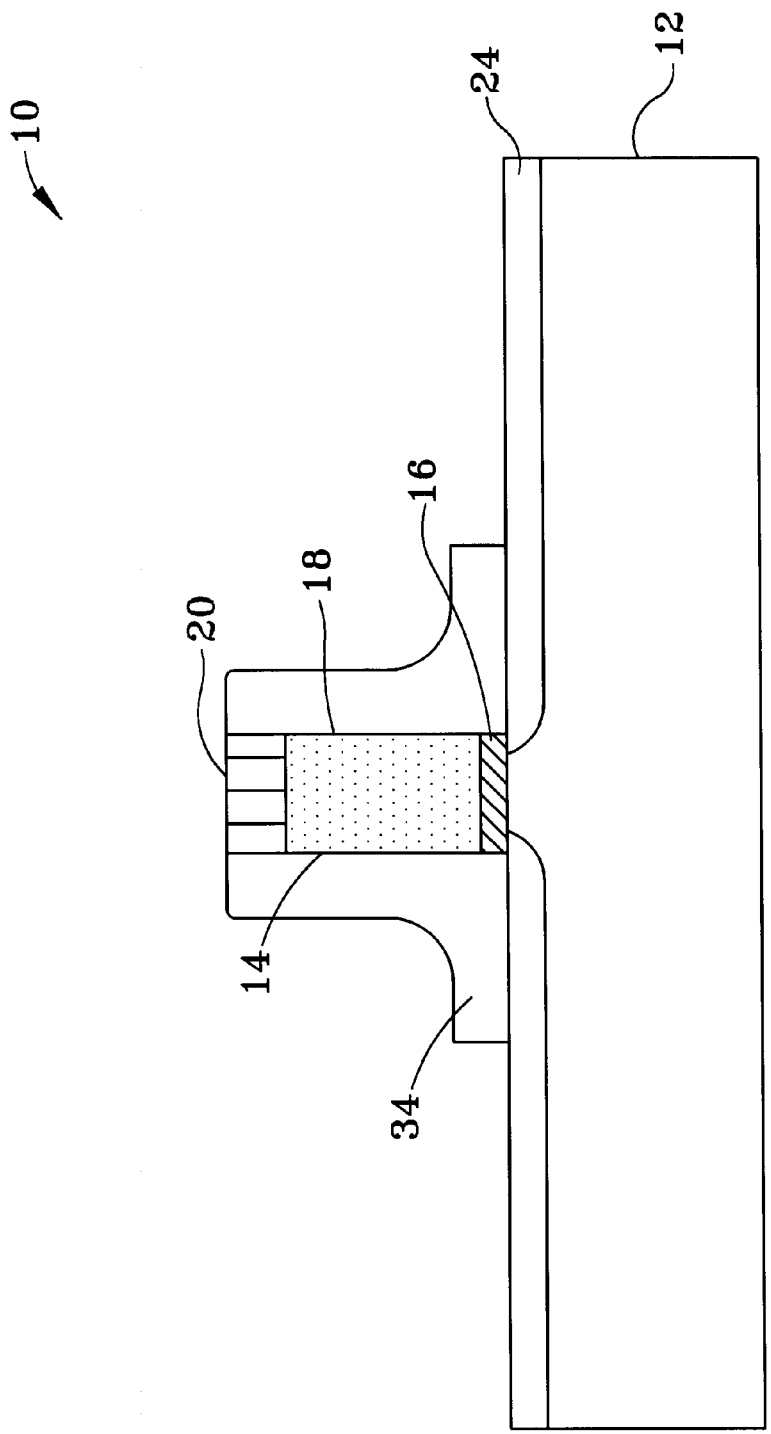
FIG. 5 is a schematic view of the CMOS transistor of FIG. 4, shown after removal of the second spacer leaving an L-shaped spacer remaining.
Figure 6:
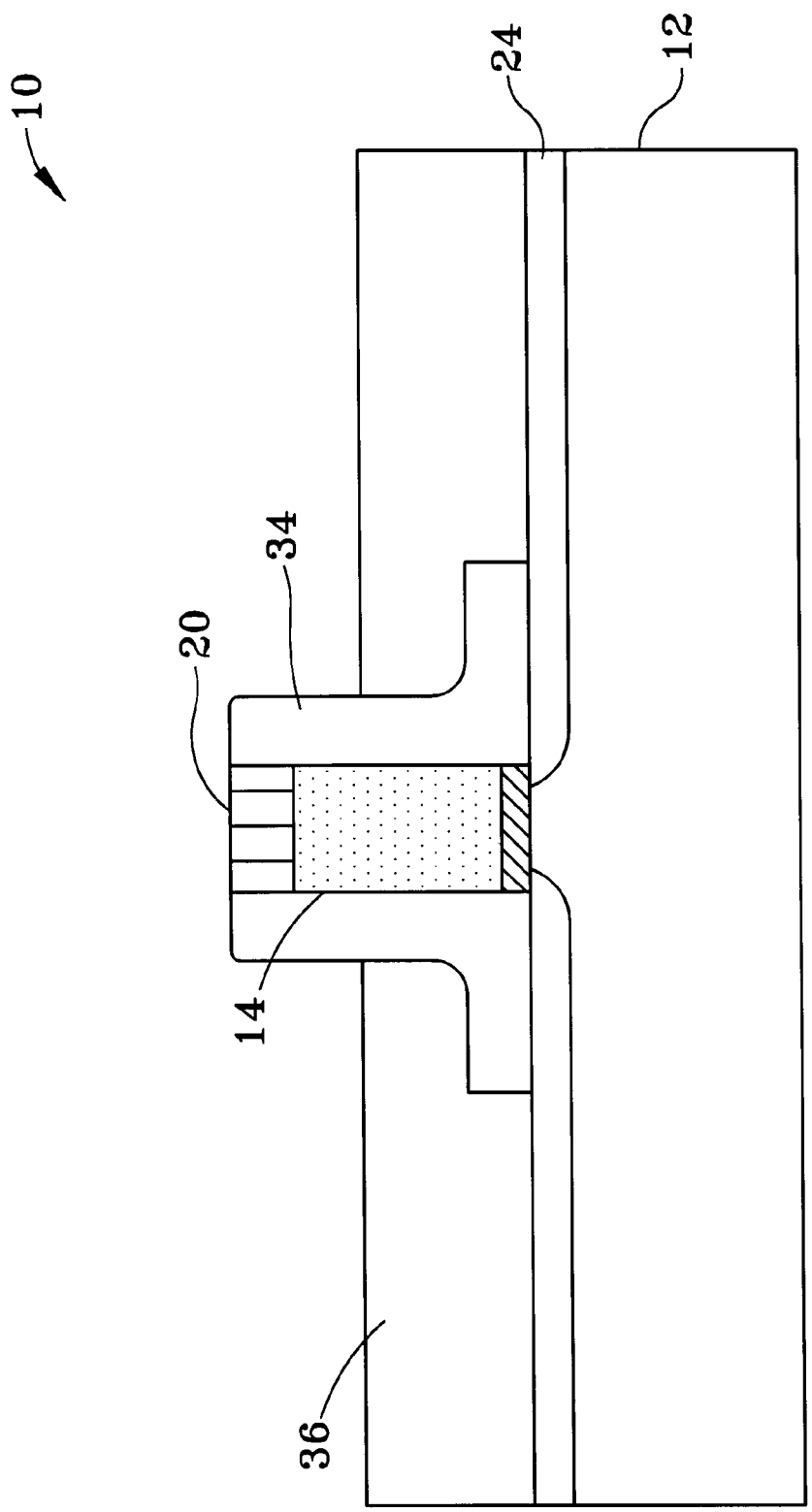
FIG. 6 is a schematic view of the CMOS transistor of FIG. 5, shown subsequent to depositing and polishing a thick amorphous silicon (a-Si) layer.
Figure 7:
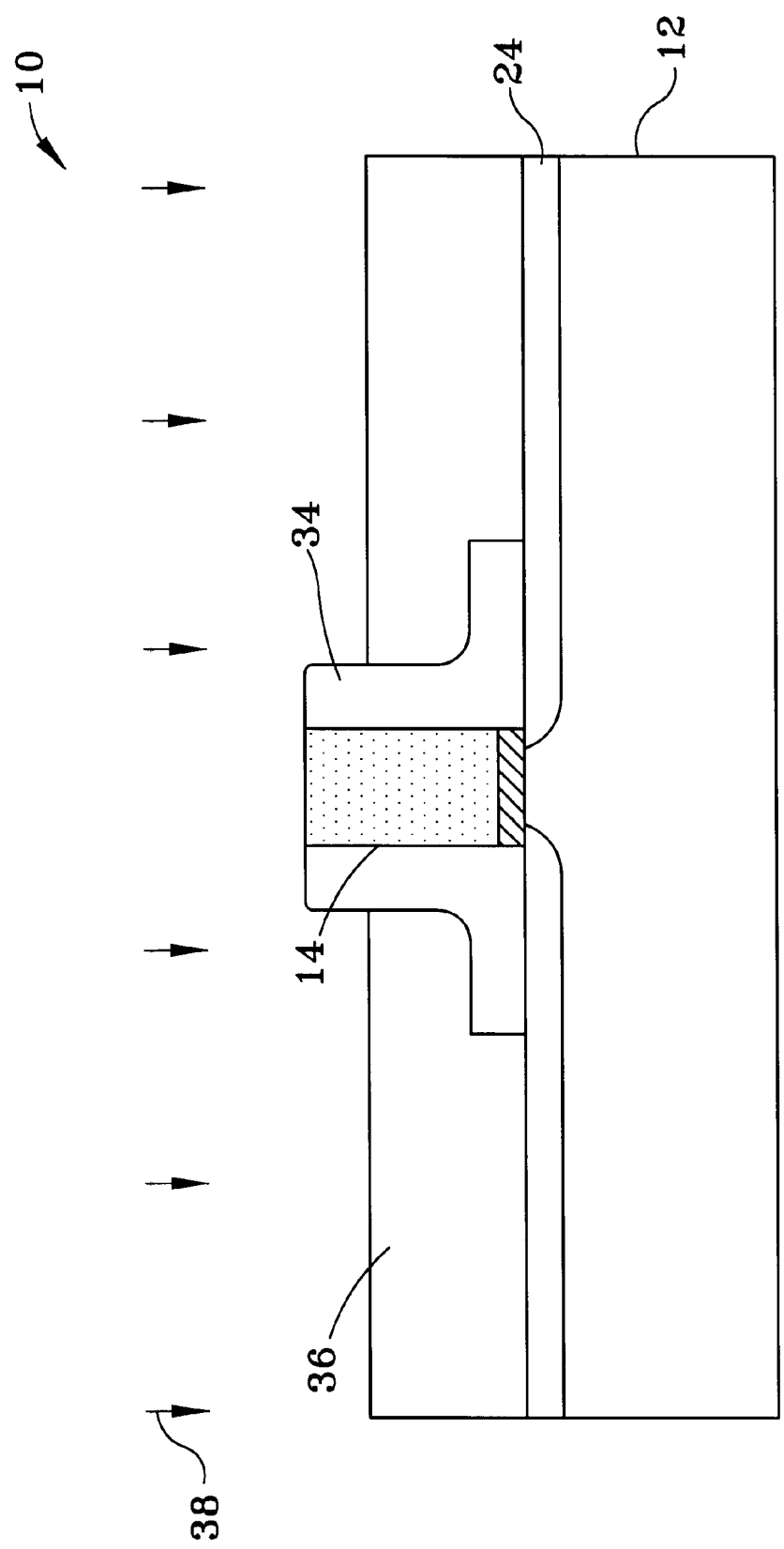
FIG. 7 is a schematic view of the CMOS transistor of FIG. 6, showing dopant implantation.
Figure 8:
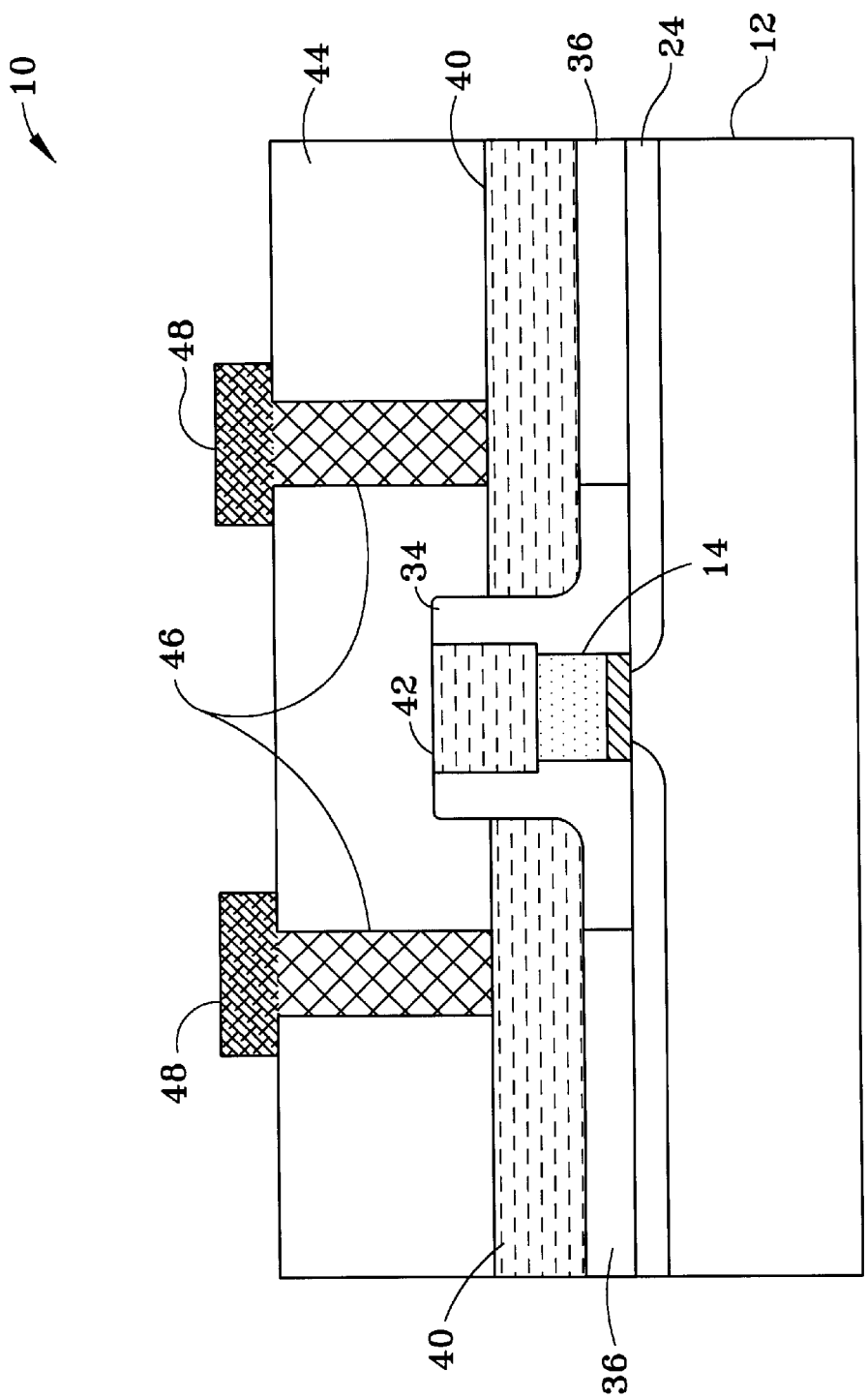
FIG. 8 is a schematic view of the CMOS transistor of FIG. 7, shown subsequent to the formation of silicide and metallic contacts.

FIG. 1 shows a CMOS transistor 10 being fabricated on a substrate 12 having a gate stack 14 which comprises a gate insulation 16 layer, gate electrode 18, and a protective capping layer 20. The capping layer is preferably formed from a layer having a depth of from approximately one hundred fifty Angstroms to two hundred Angstroms (150 Å–®Å) of an antireflective coating layer, such as SiN, which protects the electrode from selected etching processes. A first implantation process 22 preferably comprises a preamorphization implant and an extension dopant implant which forms junction 24. The preamorphization implant preferably utilizes a species such as Si, Ge, Xe, or similar. A preferred thickness for depositing the amorphous layer is between approximately ten nanometers and twenty five nanometers (10 nm–25 nm). It will be appreciated that the amorphous layer thickness is substantially equivalent to the depth of junction 24 after recrystallization or solid-state epitaxy. A first spacer 26 is deposited as shown in FIG. 2 covering the substrate and gate stack, and preferably comprises a thin nitride or oxide dielectric layer deposited to a thickness of in the range of approximately three hundred Angstroms to five hundred Angstroms (300 Å–500 Å). First spacer 26 conforms to gate stack 14 to form a vertical protrusion 28. A second spacer 30 (dummy spacer) is subsequently created at the base of vertical protrusion 28 as shown in FIG. 3. The preferred method of fabricating second spacer 30 is to deposit an insulating layer over the substrate and selectively etch the material of second spacer 30. The preferred material for second spacer 30 is oxide or nitride that has a high level of etch selectivity in relation to the material comprising the first spacer. The width of the second spacer in the illustrated embodiment is preferably within an approximate range of from twenty nanometers to forty nanometers (20 nm–40 nm). Portions 32 of first spacer 26 are etched away as shown in FIG. 4. The portions 32 of spacer 26 which are removed comprise areas of first spacer 26 not protected from the etchant by second spacer 30. Upon removal of second spacer 30, as shown in FIG. 5, an L-shaped spacer 34 remains as a remnant of deposited first spacer 26. It will be appreciated that the implantation profile of a subsequent implantation process and the gate-to-contact spacing for the device are largely determined by the size and structure of L-shaped spacer 34. A thick amorphous silicon (a-Si) layer 36 is deposited on the substrate after planarization as shown in FIG. 6. Preferably the planarization is performed within a polishing process which planarizes the amorphous silicon layer and exposes gate stack 14. Prior to planarization, the amorphous silicon (a-Si) film is preferably deposited to a depth of between approximately five thousand Angstroms to eight thousand Angstroms (5000 Å–8000 Å). Subsequent to being polishing, the amorphous silicon layer 36 preferably elevates the source and drain regions with silicon applied to a depth of approximately four hundred Angstroms to six hundred Angstroms (400 Å–600 Å) above the original substrate surface. The capping layer 20, and preferably the upper portions of L-shaped spacer 34, are removed as depicted in FIG. 7. A second implantation process 38 implants dopants within the newly deposited silicon layer which extend to the source-drain junctions within the original substrate, and are capable of supporting thick silicide. It will be appreciated that the L-shaped spacer 34 restricts implantation so that it does not alter the spacing between source and drain within the junction. After implantation, the substrate surface is preferably annealed at low temperature, such as from approximately five hundred degrees Celsius to six hundred degrees Celsius (500° C.–600° C.). Annealing the surface causes the amorphous silicon layer to recrystallize and the dopants therein to become electrically activated. FIG. 8 illustrates the formation of silicided contact areas 40 within the source and drain of CMOS transistor 10. It will be appreciated that silicide contact area 42 formed over gate electrode 18 is wider than electrode 18 due to removal of the liner oxide during etching. An insulator 44 is deposited over the silicide regions into which a contact 46 is embedded and over which metallization 46 is deposited. It will be appreciated that the gate-to-contact spacing within the resultant elevated CMOS transistor is equivalent to the thickness of the deposited first spacer layer, which by way of example is three hundred Angstroms to five hundred Angstroms (300 Å–500 Å) for the embodied device.

Accordingly, it will be seen that this invention provides numerous benefits when fabricating CMOS transistors, such as reduced source-drain series resistance and increased circuit density due to a reduction in gate-to-contact spacing. It will be appreciated that the specification describes an embodiment of the method for a specific process geometry and structure, however, the invention may be generally practiced for transistors of various configurations, processing practices, and processing geometries.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35U.S.C. 112, sixth paragraph, unless the element is expressly recited using the phrase "means for."

What is claimed is:

1. A method of fabricating elevated source-drain CMOS transistors on a substrate configured with a gate-stack, comprising:
    forming L-shaped spacers of dielectric upon the sides of the gate stack;
    depositing an amorphous silicon (a-Si) layer over the lower portions of the L-shaped spacers;
    dopant implanting to extend the source-rain junction, wherein implantation is partially blocked by the L-shaped spacer such that the junction is formed in a shape responsive to the L-shaped spacer;
    annealing the substrate; and
    forming silicide on the gate stack and source-drain areas after which conventional contact formation and metallization processes are performed to complete the CMOS transistor.

2. A method as recited in claim 1, wherein the formation of L-shaped spacers comprises:
    depositing a first dielectric material over the gate stack;
    depositing a second dielectric material over the first dielectric material;
    etching said second dielectric material to create dummy spacers adjacent the protrusions in the first material created by the underlying gate stacks;
    etching of the first material to remove portions not protected by the dummy spacers; and
    removing the dummy spacers, wherein L-shaped spacers of the first material remain adjacent the gate stack.

3. A method as recited in claim 1, wherein depositing an amorphous silicon (a-Si) layer over the lower portions of the L-shaped spacers comprises depositing amorphous silicon over the substrate and polishing the amorphous silicon layer to expose the gate stack.

4. A method as recited in claim 1, wherein the gate stack is configured with a capping layer for protection against etching.

5. A method as recited in claim 4, wherein the capping layer comprises an antireflective coating.

6. A method as recited in claim 4, wherein the capping layer comprises silicon nitride (SiN).

7. A method as recited in claim 4, wherein the upper portion of the L-shaped spacers and capping layer of the gate stack are removed after deposition of the amorphous silicon layer.

8. A method of fabricating elevated source-drain CMOS transistors on a substrate having a gate stack with a capping layer, comprising:

depositing a first dielectric layer over the gate stack;

depositing a second dielectric layer over the first dielectric material;

etching said second dielectric layer to create dummy spacers adjacent the protrusions in the first material created by the underlying gate stacks;

etching of the first dielectric layer to remove portions not protected by the dummy spacers;

removing dummy spacers, wherein L-shaped spacers of the first dielectric layer remain adjacent the gate stack;

depositing an amorphous silicon (a-Si) layer;

polishing the amorphous silicon (a-Si) layer to expose the gate stack;

removing of the upper portion of the L-shaped spacers and capping layer of the gate stack;

implanting dopants to extend the source-drain junction, wherein the depth of extension is responsive to partial implantation blockage by the L-shaped spacer;

annealing the substrate; and forming silicide on the gate stack and source-drain areas after which conventional contact formation and metallization processes are performed to complete the CMOS transistor.

9. A method as recited in claim 8, wherein the first dielectric layer is deposited to a depth which is less that the height of the gate stack.

10. A method as recited in claim 8, wherein the first dielectric layer is deposited to a depth of between 300 Angstroms and 500 Angstroms.

11. A method as recited in claim 8, wherein implantation comprises a source-drain preamorphization implant and dopant implant.

12. A method as recited in claim 11, wherein the source-drain preamorphization implant is performed to a depth of from 10 nanometers to 25 nanometers.

13. A method as recited in claim 12, wherein the dopants being implanted are selected from the group of semiconductor dopants consisting of Si, Ge, and Xe.

14. A method as recited in claim 8, wherein the second dielectric layer is selected from material that provides etch selectivity from the material of the first dielectric layer.

15. A method as recited in claim 8, wherein the dummy spacers are configured in a width of from 20 nanometers to 40 nanometers.

16. A method as recited in claim 8, wherein the amorphous silicon layer is deposited to a depth of from 5000 Angstroms to 8000 Angstroms.

17. A method as recited in claim 8, wherein annealing is performed until the amorphous silicon layer is recrystallized and the dopant activated.

18. A method as recited in claim 17, wherein annealing is performed at low temperatures in the range from 500 ° C. to 600 ° C.

* * * * *